US007705442B2

(12) United States Patent
Schlötterer

(10) Patent No.: US 7,705,442 B2
(45) Date of Patent: Apr. 27, 2010

(54) CONTACT DEVICE FOR USE IN A POWER SEMICONDUCTOR MODULE OR IN A DISC-TYPE THYRISTOR

(75) Inventor: André Schlötterer, Nürnberg (DE)

(73) Assignee: SEMIKRON Elektronik GmbH & Co. KG, Nürnberg (DE)

(*) Notice: Subject to any disclaimer, the term of this patent is extended or adjusted under 35 U.S.C. 154(b) by 386 days.

(21) Appl. No.: 11/881,966

(22) Filed: Jul. 30, 2007

(65) Prior Publication Data
US 2008/0023818 A1 Jan. 31, 2008

(30) Foreign Application Priority Data
Jul. 28, 2006 (DE) .................. 10 2006 034 964

(51) Int. Cl.
H01L 23/48 (2006.01)
(52) U.S. Cl. .................. 257/689; 257/E23.078; 257/688; 257/710; 257/726; 439/700; 439/824; 361/719
(58) Field of Classification Search .......... 257/E23.078, 257/E23.09, E23.183, E23.187, 156, 500, 257/726, 688–690, 710, 719; 439/562, 625, 439/700, 824; 361/704, 710, 719; 363/56.03
See application file for complete search history.

(56) References Cited
U.S. PATENT DOCUMENTS

| 5,451,165 | A | * | 9/1995 | Cearley-Cabbiness et al. .................. 439/71 |
| 5,940,273 | A | * | 8/1999 | Fishman et al. ............. 361/704 |
| 5,990,549 | A | * | 11/1999 | Chiu et al. .................. 257/706 |
| 6,107,711 | A | * | 8/2000 | Borchert .................. 310/68 D |
| 6,285,076 | B1 | * | 9/2001 | Ando ......................... 257/688 |
| 6,504,445 | B1 | * | 1/2003 | Kocharyan ................... 333/1.1 |
| 6,608,753 | B2 | * | 8/2003 | Wakabayashi et al. ...... 361/719 |
| 7,331,805 | B1 | * | 2/2008 | Hu ............................. 439/188 |
| 7,396,261 | B2 | * | 7/2008 | Kroneder et al. ........... 439/700 |
| 2006/0152952 | A1 | | 7/2006 | Hager |
| 2006/0154257 | A1 | | 7/2006 | Kroneder et al. |
| 2008/0023818 | A1 | * | 1/2008 | Schlotterer .................. 257/690 |

FOREIGN PATENT DOCUMENTS
DE 10 2004 050 588 4/2006
DE 10 2004 058 946 6/2006

* cited by examiner

Primary Examiner—Chris C Chu
(74) Attorney, Agent, or Firm—Cohen Pontani Lieberman & Pavane LLP

(57) ABSTRACT

A contact device for use with a power semiconductor component in a power semiconductor module or a disc-type thyristor, the module or thyristor having a molded body with a first recess disposed above the component. The contact device makes electrical contact with the auxiliary connection of the component, and is disposed within a second recess in the module or thyristor. The contact device includes a spring having a pin-like extension at a first end thereof that faces the component and a metal molded body that is arranged at the opposite end thereof and has a first connecting device formed as a flat section of the metal molded body. The flat section is arranged generally parallel to the component, and has a second connecting device for connection to a connecting cable. The connecting device may also have a multipart insulating housing for holding the contact spring and the metal molded body.

20 Claims, 3 Drawing Sheets

CONTACT DEVICE FOR USE IN A POWER SEMICONDUCTOR MODULE OR IN A DISC-TYPE THYRISTOR

BACKGROUND OF THE INVENTION

1. Field of the Invention

The invention is directed to a contact device for the control connection of a power semiconductor component in disc-type thyristors and/or power semiconductor modules.

2. Description of the Related Art

Prior art known contact devices are described, for example, in German Patent Applications Nos. DE 10 2004 058 946 A1 and DE 10 2004 050 588.

German Patent Application No. DE 10 2004 058 946 A1 discloses a disc-type thyristor having a control connection for control contact of a power semiconductor component, the control connection being in the form of a wire element which is guided in a plastic sleeve in the region of the power semiconductor component. This plastic sleeve, and thus the contact area of the wire for control contact, are pushed in the direction of the power semiconductor component by a spring. Such a configuration may be complicated to manufacture since it has several independently manufactured parts or subassembly.

German Patent Application No. DE 10 2004 050 588 discloses an arrangement having a power semiconductor component in a power semiconductor module or a disc-type thyristor, and a molded body which has a recess containing an abutment in the region of the control connection disposed above the power semiconductor component. The contact device itself comprises a contact spring having a pin-like extension at that end of the spring which makes contact with the control connection and also having a connection, which is formed using a metal molding, to a connecting cable for external connection, at the other end of the spring. To this end, the contact device has a sleeve formed of an insulating material with a contact spring, the insulating sleeve also having latching lugs which, together with an abutment on the molded body, form a snap-action latching connection. The disadvantage of this configuration of the contact device is that it has a large overall height and therefore cannot be arranged in some compact power semiconductor modules or disc-type thyristors.

There is thus a need in the art for an improved contact device for use with power semiconductor modules and/or disc-type thyristors.

It is therefore an object of the invention to provide an improved contact device for use with power semiconductor modules and/or disc-type thyristors.

SUMMARY OF THE INVENTION

The invention is directed to a contact device for connection of power semiconductor components in disc-type thyristors and/or power semiconductor modules, which arrangement is compact, may be used universally, ensures permanently reliable electrical contact and is capable of simple assembly in the form of a subassembly.

The invention is intended for use in a power semiconductor module, preferably in pressure contact with one or more power semiconductor components, or with a disc-type thyristor. Only one power semiconductor component is typically arranged in a disc-type thyristor, but there are special forms thereof that may employ a plurality of power semiconductor components in one housing.

The invention is also intended for use with power semiconductor modules or disc-type thyristors having at least one controlled power semiconductor component such as a thyristor or a transistor. Such devices usually have one control connection and usually also at least one auxiliary connection for each controlled power semiconductor component, said connections each being connected to one or more external contact devices.

In this case, the power semiconductor component in a power semiconductor module or a disc-type thyristor generally has a molded body with at least one recess above the power semiconductor component. At least one inventive contact device for making contact with the auxiliary or control connection of the power semiconductor component is intended to be arranged in that recess.

The contact device itself comprises a contact spring having a pin-like extension at a first end of the spring that faces the power semiconductor component. A metal molded body having a first connecting device in the form of a flat section of the metal molded body, which is arranged parallel to the power semiconductor component, and having a second connecting device for connection to a connecting cable is provided at the second, opposite, end of the spring. The contact device also may have a multipart housing formed of an insulating material for retaining the contact spring and the metal molded body. To this end, this insulating housing has a first recess for the pin-like extension and a second laterally arranged recess for the second connecting device.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The inventive concept is explained in more detail using the exemplary embodiments in FIGS. 1 to 3.

DETAILED DESCRIPTION OF THE PRESENTLY PREFERRED EMBODIMENTS

Figure 1:
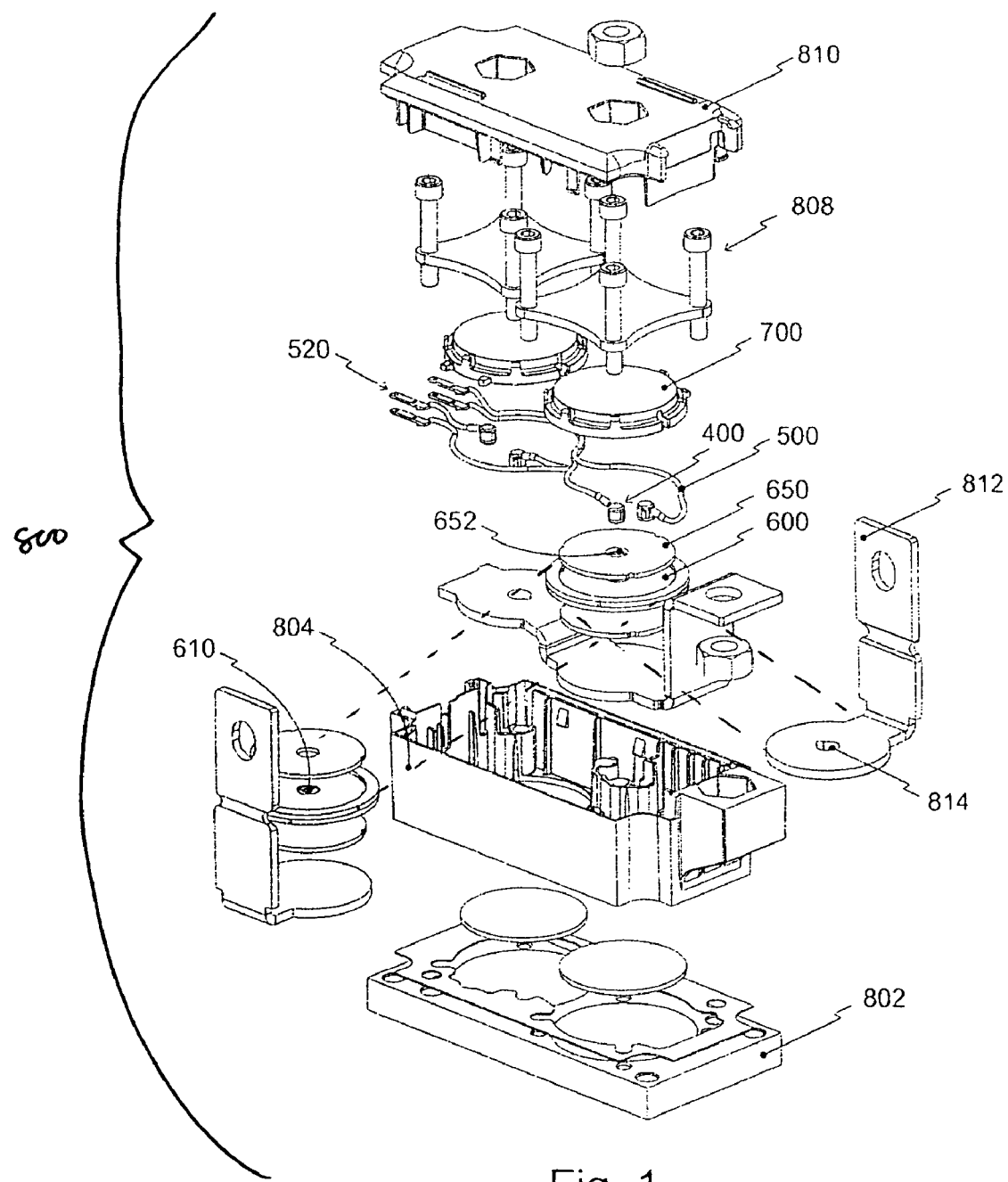
FIG. 1 shows a three-dimensional exploded perspective view of a power semiconductor module having an inventive contact device.

FIG. 1 shows a three-dimensional exploded perspective of an inventive arrangement in the form of a power semiconductor module 800 having a contact device 400. Power semiconductor module 800 has two power semiconductor components, such as thyristors 600, preferably constructed using pressure contact technology. The following are arranged in a suitable manner on a base plate 802.

insulation material for electrically insulating the current-carrying parts of the power semiconductor module 800 from base plate 802;

two thyristors 600 having suitable electrical load connection elements 812, each preferably formed as a metal molded body;

two molded bodies 700 for holding the contact devices 400 and for applying pressure to power semiconductor components 600;

a pressure contact device 808; and a housing 804 having a cover 810.

Power semiconductor components 600 in pressure-contacted power semiconductor modules 800 and disc-type thyristors are often connected on both sides to a respective flat metal body 650 whose coefficient of thermal expansion is between that of the power semiconductor component 600 and that of an adjoining load connection 812, to reduce the thermal stress exerted upon power semiconductor component 600. Power semiconductor component 600 can be connected to the flat metal bodies 650, which are preferably formed of molybdenum, using different methods, for example by soldering, adhesive bonding or pressure-contacting the two components. Flat metal body 650 typically has a thickness in the order of magnitude of from a few tenths of a millimeter to several millimeters.

Figure 3A:
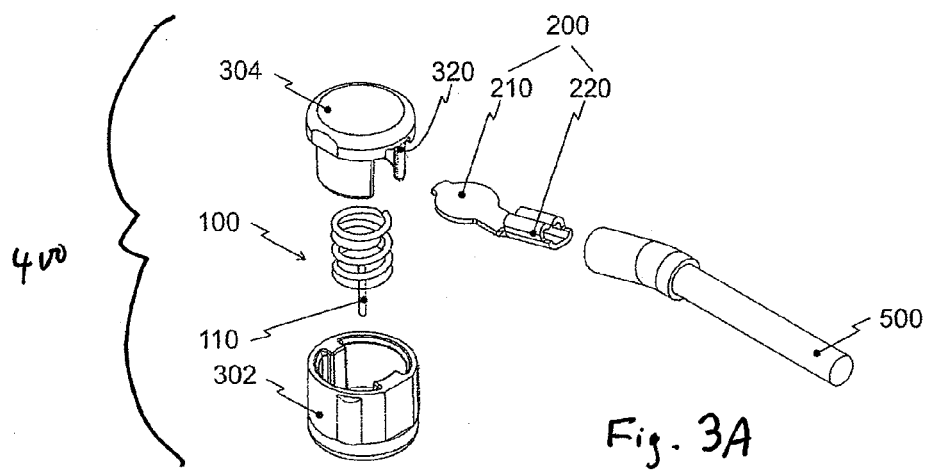
FIGS. 3A and 3B show a detailed illustration of an inventive contact device, FIG. 3A showing the contact device in an exploded perspective view, FIG. 3B showing that contact device assembled, in cross-section.
Figure 3B:
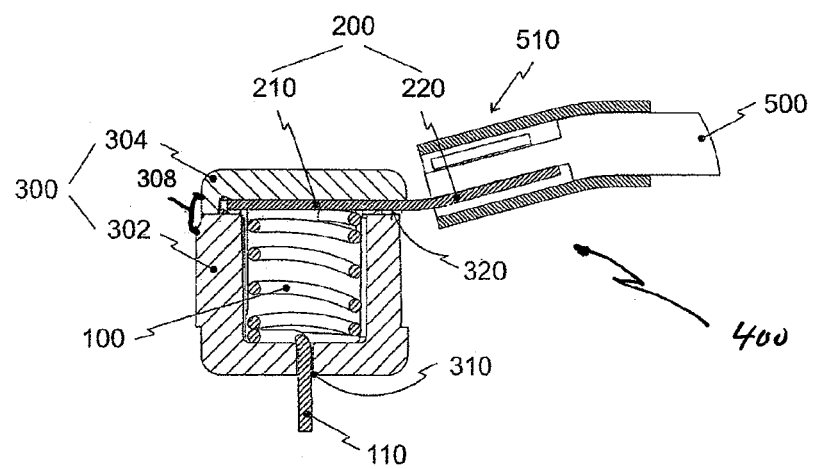

In this case, contact device 400 is a subassembly of the larger assembly of power semiconductor module 800, contact device 400 being arranged in molded body 700 and thus being open to simple assembly of power semiconductor module 800. To this end, two respective contact devices 400 are inserted into associated molded bodies 700. These molded bodies 700 are formed from a thermosetting plastic, since they are used only to introduce pressure via pressure contact device 808 but not for establishing electrical connection, since load connections 812 are formed as metal connecting tabs in this case. Contact device 400 is electrically connected with the exterior of module 800 using a cable 500 having a connector 520 which is connected to the exterior connections. Cable 500 is preferably crimped to contact device 400 via a crimping connection 220, 510 (FIGS. 3A and 3B).

Contact device 400 also preferably has a plastic housing 300 to electrically insulate the control signal, for example, from the power connection which is formed by metal molded body 812.

Figure 2:
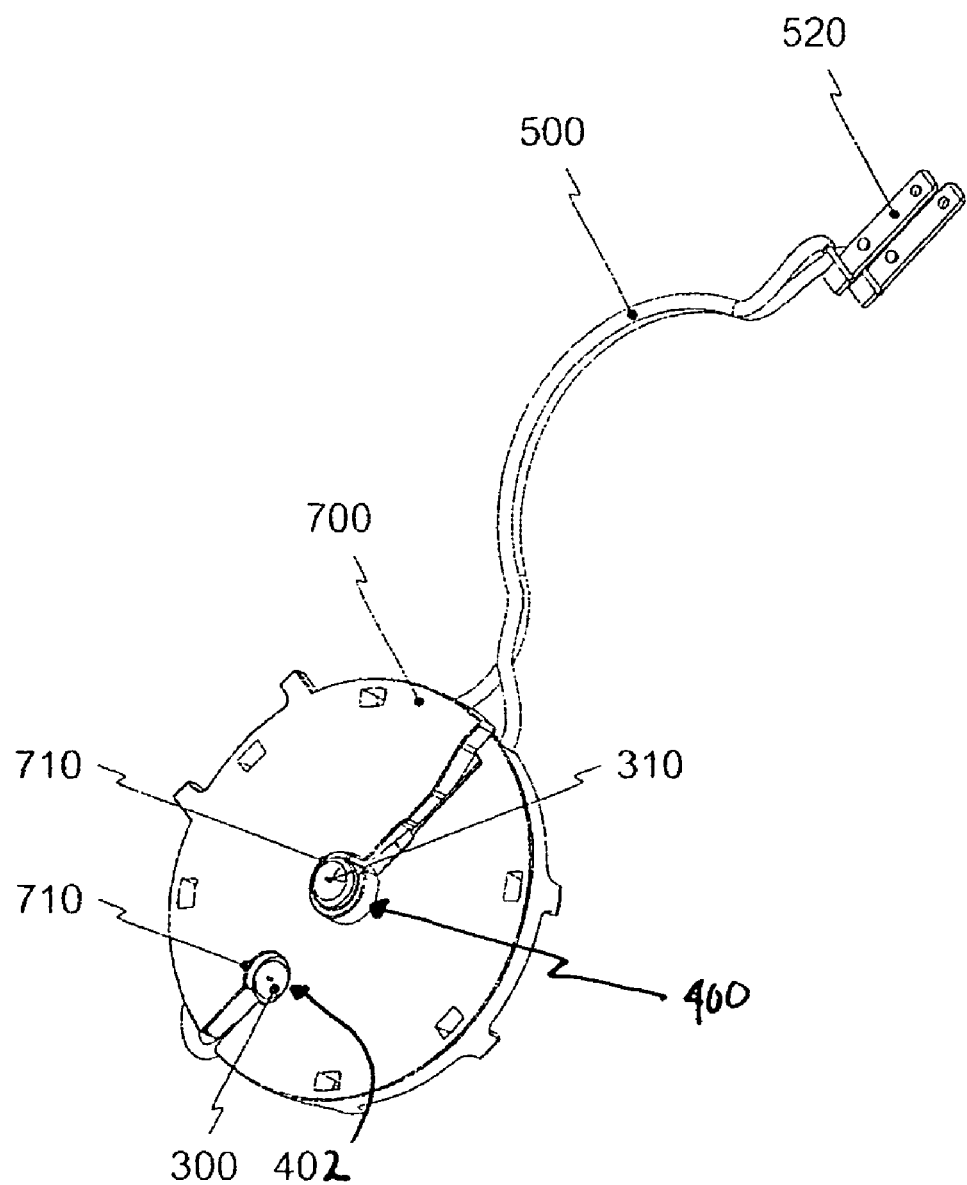
FIG. 2 shows two inventive contact devices arranged in a molded body.

FIG. 2 shows two inventive contact devices 400 arranged in a molded body 700. Molded body 700 preferably is formed of thermosetting plastic with two recesses 710 for respective contact devices 400, 402. Each contact device 400, 402 has a plastic housing 300, and a recess 310 provided on the side of contact device 400 that faces power semiconductor component 600 (cf. FIG. 1). A pin-like extension 110 of a contact spring 100 (FIG. 3) projects through recess 310.

In the case of centrally located contact device 400, pin-like extension 110 is used to make contact with the control connection (not shown) of the power semiconductor component 600. To this end, contact device 400, in order to make contact with the control connection, partially extends through an aperture 652, 814 (FIG. 1) in at least one flat metal molded body 650, 812, respectively, which is arranged between power semiconductor component 600 and the molded body. Pin-like extension 110 is thus electrically conductively connected to control contact area 610 of power semiconductor component 600.

Contact device 402 is not positioned centrally in molded body 700, is used to make auxiliary contact with the power semiconductor component 600, and is known as an auxiliary emitter, for example. To this end, further contact device 402 which is essentially identical to centrally arranged contact device 400 is likewise arranged in molded body 700. However, the recess 710 associated with contact device 402 is deeper than that associated with contact device 400, with the result that pin-like extension 110 of contact device 402 for making contact with the auxiliary connection is in electrical contact with flat metal molded body 650 (FIG. 1) arranged between power semiconductor component 600 and molded body 700, or power connecting element 812.

Connecting cables 500 from contact devices 400, 402 lead to a respective connector 520, which forms the associated external connections of power semiconductor module 800.

A detailed illustration of an inventive contact device 400 is shown in an exploded perspective (FIG. 3A) and in section (FIG. 3B). Contact device 400 comprises a multipart, in this case two-part, insulating housing 300, a contact spring 100 and a metal molded body 200.

Contact spring 100 is formed as a helical spring with a pin-like extension 110 at a first end of the spring. Extension 110 is used to make contact with control connection 610 of power semiconductor component 600 (FIG. 1). The resilient section of contact spring 100 is used for the introduction of pressure, which is constant over the service life of the disc-type thyristor or power semiconductor module 800, and thus to reliably make contact with the control connection 610. The second, opposite, end of the spring is used to make electrical contact with metal molded body 200.

As a first connecting device 210 for contact spring 100, metal molded body 200 has a first flat section arranged substantially parallel to power semiconductor component 600. It also has a second connecting device 220 for connection to a connecting cable 500. Connecting device 220 of metal molded body 200 is preferably formed as a crimping connection for connecting cable 500.

Insulating housing 300 has two parts, an upper part 304 partially projecting into the lower part 302 (FIG. 3A) and the two parts are thus fixed relative to one another. Alternatively, a snap-action latching connection 308 (FIG. 3B) may be provided between the two parts 302, 304. As a result of the two parts 302, 304 being connected, a flat section, the first connecting device 210, of the metal molded body 200 is pressed onto the second end of the spring (i.e., the end opposite pin-like projection 110) and spring 100 itself is simultaneously slightly stressed, thereby exerting pressure on pin-like extension 110 to contact control connection 610 (FIG. 1).

On its side facing the power semiconductor component 600 (FIGS. 1 and 2), lower part 302 of insulating material housing 300 has a recess 310 as a bushing for pin-like extension 110 of contact spring 100. Upper part 304 of insulating housing 300 has a lateral recess 320 for guiding through the connecting device 220 of metal molded body 200.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A contact device for use with a power semiconductor component disposed within one of a power semiconductor module and a disc-type thyristor, the one of the power semiconductor module and the thyristor having a first molded body which has at least one first recess disposed above the power semiconductor component, the power semiconductor component having an auxiliary connection and a control connection;
the contact device being configured to contact at least one of the auxiliary connection and the control connections, and also being configured for disposition in the first recess in the first molded body,
the contact device comprising:
a contact spring having a first end facing the power semiconductor component and a second end opposite thereto, said first end including a pin-like extension;
a metal second molded body which is disposed at said second end of said contact spring, said metal second molded body having
a first connecting device which is formed as a flat section of said metal second molded body, and which is also arranged substantially parallel to the power semiconductor component; and
a second connecting device for connection to a connecting cable; and
an insulating housing for carrying said contact spring and said metal second molded body, said insulating housing having a second recess configured to receive said pin-like extension and a third laterally arranged recess configured to receive said second connecting device.

2. The control device of claim 1, wherein said insulating housing is formed of at least a first part and a second part; and
wherein said first part and said second part are connected by a snap-action latch.

3. The control device of claim 1, wherein said insulating housing is formed of at least a first part and a second part, said first part being disposed within said second part thereby pressing said metal second molded body onto said second end of said spring and slightly stressing said spring.

4. The control device of claim 1, wherein said contact spring is formed as a helical spring.

5. The control device of claim 1, wherein said second connecting device of said metal second molded body is crimped to said connecting cable.

6. The control device of claim 1,
wherein the power semiconductor component includes a control contact area;
wherein the one of the power semiconductor module and the thyristor includes a third molded body having a second aperture therein through which the control connection of the power semiconductor component may be accessed, the third molded body being disposed between the power semiconductor component and the first molded body; and
wherein said pin-like extension is configured to be in electrical contact with the control contact area of the power semiconductor component through the second aperture.

7. The control device of claim 6, wherein said pin-like extension is in electrical contact with the auxiliary connection of the power semiconductor component through the third molded body.

8. A power semiconductor module for use with a power semiconductor component having an auxiliary connection and a control connection, the power semiconductor module comprising:

a first molded body having at least one first recess therein, said first molded body being disposed above the power semiconductor component; and
a contact device configured to contact at least one of the auxiliary connection and the control connections, said contact device being disposed in said first recess;
said contact device including:
a contact spring having a first end facing the power semiconductor component and a second end opposite thereto, said first end including a pin-like extension;
a metal second molded body which is disposed at said second end of said contact spring, said metal second molded body having:
a first connecting device which is formed as a flat section of said metal second molded body, and which is also arranged substantially parallel to the power semiconductor component; and
a second connecting device for connection to a connecting cable; and
an insulating housing for carrying said contact spring and said metal second molded body, said insulating housing having a first recess configured to receive said pin-like extension and a second laterally arranged recess configured to receive said second connecting device.

9. The power semiconductor module of claim 8, wherein said insulating housing is formed of at least a first part and a second part; and
wherein said first part and said second part are connected by a snap-action latch.

10. The power semiconductor module of claim 8, wherein said insulating housing is formed of at least a first part and a second part, said first part being disposed within said second part thereby pressing said metal second molded body onto said second end of said spring and slightly stressing said spring.

11. The power semiconductor module of claim 8, wherein said contact spring is formed as a helical spring.

12. The power semiconductor module of claim 8, wherein said second connecting device of said metal second molded body is crimped to said connecting cable.

13. The power semiconductor module of claim 8,
wherein the power semiconductor component includes a control contact area;
wherein the power semiconductor module further comprises a third molded body having a second aperture therein through which the control connection of the power semiconductor component may be accessed, said third molded body being disposed between the power semiconductor component and said first molded body; and
wherein said pin-like extension is configured to be in electrical contact with the control contact area of the power semiconductor component through said second aperture.

14. The power semiconductor module of claim 13, wherein said pin-like extension is in electrical contact with the auxiliary connection of the power semiconductor component through said third molded body.

15. A disc-type thyristor for use with a power semiconductor component having an auxiliary connection and a control connection, the disc-type thyristor comprising:
a first molded body having at least one first recess therein, said first molded body being disposed above the power semiconductor component; and a contact device configured to contact at least one of the auxiliary connection and the control connections, said contact device being disposed in said first recess;

said contact device including:

a contact spring having a first end facing the power semiconductor component and a second end opposite thereto, said first end including a pin-like extension;

a metal second molded body which is disposed at said second end of said contact spring, said metal second molded body having:

a first connecting device which is formed as a flat section of said metal second molded body, and which is also arranged substantially parallel to the power semiconductor component; and a second connecting device for connection to a connecting cable; and an insulating housing for carrying said contact spring and said metal second molded body, said insulating housing having a first recess configured to receive said pin-like extension and a second laterally arranged recess configured to receive said second connecting device.

16. The disc-type thyristor of claim 15, wherein said insulating housing is formed of at least a first part and a second part; and wherein said first part and said second part are connected by a snap-action latch.

17. The disc-type thyristor of claim 15, wherein said insulating housing is formed of at least a first part and a second part said first part being disposed within said second part thereby pressing said metal second molded body onto said second end of said spring and slightly stressing said spring.

18. The disc-type thyristor of claim 15, wherein said contact spring is formed as a helical spring.

19. The disc-type thyristor of claim 15, wherein said second connecting device of said metal second molded body is crimped to said connecting cable.

20. The disc-type thyristor of claim 15, wherein the power semiconductor component includes a control contact area;

wherein the disc-type thyristor further comprises a third molded body having a second aperture therein through which the control connection of the power semiconductor component may be accessed, said third molded body being disposed between the power semiconductor component and said first molded body; and wherein said pin-like extension is configured to be in electrical contact with the control contact area of the power semiconductor component through said second aperture.

* * * * *